United States Patent
Fisher et al.

(10) Patent No.: US 6,534,379 B1
(45) Date of Patent: Mar. 18, 2003

(54) LINERLESS SHALLOW TRENCH ISOLATION METHOD

(75) Inventors: Philip Fisher, Foster City, CA (US); Ming-Ren Lin, Cupertino, CA (US); Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/051,698

(22) Filed: Jan. 18, 2002

Related U.S. Application Data (60) Provisional application No. 60/278,896, filed on Mar. 26, 2001.

(51) Int. Cl.[7] .............................................. H01L 21/76
(52) U.S. Cl. ...................................................... 438/424
(58) Field of Search ................................. 438/424, 427, 438/435

(56) References Cited

U.S. PATENT DOCUMENTS

| | | | |
|---|---|---|---|
| 4,903,108 A | 2/1990 | Young et al. | |
| 4,916,086 A | 4/1990 | Takahashi et al. | |
| 5,021,359 A | 6/1991 | Young et al. | |
| 5,034,789 A | 7/1991 | Black | 257/66 |
| 5,126,817 A | 6/1992 | Baba et al. | |
| 5,258,332 A | 11/1993 | Horioka et al. | 438/424 |
| 5,264,395 A | 11/1993 | Bindal et al. | 438/404 |
| 5,279,865 A | 1/1994 | Chebi et al. | 427/574 |
| 5,405,480 A | 4/1995 | Benzing et al. | 156/345 |
| 5,416,041 A | 5/1995 | Schwalke | |
| 5,416,048 A | 5/1995 | Blalock et al. | 438/695 |
| 5,445,988 A | 8/1995 | Schwalke | |
| 5,470,802 A | 11/1995 | Gnade et al. | 438/781 |
| 5,497,765 A | 3/1996 | Schwalke | |
| 5,516,710 A | 5/1996 | Boyd et al. | 438/309 |
| 5,569,058 A | 10/1996 | Gnade et al. | 445/24 |
| 5,578,518 A | 11/1996 | Koike et al. | 438/424 |

(List continued on next page.)

FOREIGN PATENT DOCUMENTS

| | | | | |
|---|---|---|---|---|
| JP | 60-058636 | * | 4/1985 | H01L/21/76 |
| JP | 61-091928 | * | 5/1986 | H01L/21/302 |

OTHER PUBLICATIONS

C.L. Huang et al., Degradation Characteristics of STI and MESA–Isolated Thin–Film SOI CMOS. IEEE 1997, pp. 474–476.*

T. Iwamatsu et al., Suppresion of Stress Induced Drain Leakage Current of SOI MOSFETs by Using Partial Trench Isolation Technology. IEEE 2000, pp. 80–81.*

(List continued on next page.)

Primary Examiner—Olik Chaudhuri
Assistant Examiner—Anh Duy Mai
(74) Attorney, Agent, or Firm—Renner, Otto, Boisselle & Sklar, LLP

(57) ABSTRACT

A method of making a semiconductor device and a method of isolation of active islands on a silicon-on-insulator semiconductor device, comprising the steps of providing a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate; forming an isolation trench, the isolation trench defining an active island in the silicon active layer; rounding at least one corner in the active island by application of a high RF bias power high density plasma; and filling the isolation trench with a dielectric trench isolation material by application of a low RF bias power high density plasma. In one embodiment, the rounding step comprises application of a HDP under etching conditions, and the filling step comprises application of a HDP under deposition conditions.

18 Claims, 4 Drawing Sheets

U.S. PATENT DOCUMENTS

| | | | |
|---|---|---|---|
| 5,599,722 A | 2/1997 | Sugisaka et al. | 438/406 |
| 5,641,711 A | 6/1997 | Cho | 438/763 |
| 5,646,053 A | 7/1997 | Schepis et al. | 438/402 |
| 5,683,075 A | 11/1997 | Gaul et al. | 257/510 |
| 5,741,740 A | 4/1998 | Jang et al. | |
| 5,783,476 A | 7/1998 | Arnold | 438/424 |
| 5,807,771 A | 9/1998 | Vu et al. | 438/154 |
| 5,837,612 A | 11/1998 | Ajuria et al. | 438/424 |
| 5,841,171 A | 11/1998 | Iwamatsu et al. | |
| 5,863,827 A * | 1/1999 | Joyner | 438/424 |
| 5,874,317 A * | 2/1999 | Stolmejer | 438/424 |
| 5,891,803 A | 4/1999 | Gardner | 438/660 |
| 5,895,254 A * | 4/1999 | Huang et al. | 438/424 |
| 5,914,280 A | 6/1999 | Gelzinis | |
| 5,915,192 A | 6/1999 | Liaw et al. | 438/435 |
| 5,933,749 A * | 8/1999 | Lee | 438/424 |
| 5,981,402 A | 11/1999 | Hsiao et al. | 438/756 |
| 5,994,756 A | 11/1999 | Umezawa et al. | 257/510 |
| 6,025,269 A | 2/2000 | Sandhu | 438/688 |
| 6,046,106 A | 4/2000 | Tran et al. | 438/660 |
| 6,048,445 A | 4/2000 | Brain | 205/118 |
| 6,054,206 A | 4/2000 | Mountsier | 428/312.8 |
| 6,057,214 A | 5/2000 | Joyner | 438/424 |
| 6,074,931 A | 6/2000 | Chang et al. | 438/424 |
| 6,077,768 A | 6/2000 | Ong et al. | 438/622 |
| 6,096,612 A | 8/2000 | Houston | 438/424 |
| 6,096,621 A | 8/2000 | Jennings | 438/404 |
| 6,106,678 A | 8/2000 | Shufflebotham et al. | 204/192.32 |
| 6,110,793 A | 8/2000 | Lee et al. | 438/400 |
| 6,114,741 A | 9/2000 | Joyner et al. | 257/506 |
| 6,118,167 A | 9/2000 | DiSimone et al. | 257/510 |
| 6,118,168 A | 9/2000 | Moon et al. | 257/513 |
| 6,121,148 A | 9/2000 | Bashir et al. | 438/692 |
| 6,124,212 A | 9/2000 | Fan et al. | 438/709 |
| 6,127,242 A | 10/2000 | Batra et al. | 438/400 |
| 6,127,244 A | 10/2000 | Lee | 438/458 |
| 6,130,467 A | 10/2000 | Bandyopadhyay et al. | 257/506 |
| 6,136,713 A | 10/2000 | Chen et al. | 438/692 |
| 6,137,152 A | 10/2000 | Wu | 257/510 |
| 6,146,970 A | 11/2000 | Witek et al. | 438/424 |
| 6,147,402 A | 11/2000 | Joshi et al. | 257/751 |
| 6,150,234 A | 11/2000 | Olsen | 438/424 |
| 6,165,869 A | 12/2000 | Qian et al. | 438/424 |
| 6,171,917 B1 | 1/2001 | Sun et al. | 438/305 |
| 6,171,962 B1 | 1/2001 | Karlsson et al. | 438/692 |
| 6,174,785 B1 | 1/2001 | Parekh et al. | 438/424 |
| 6,177,331 B1 * | 1/2001 | Koga | 438/424 |
| 6,268,268 B1 | 7/2001 | Tokushige | |
| 6,335,261 B1 * | 1/2002 | Natzle et al. | 438/424 |
| 6,363,254 B1 | 3/2002 | Lee et al. | |
| 6,368,941 B1 | 4/2002 | Chen et al. | |
| 6,391,729 B1 * | 5/2002 | Hui | 438/424 |
| 2002/0048897 A1 * | 4/2002 | Hong | 438/424 |

OTHER PUBLICATIONS

W.G. En et al., Reductuion of STI/Active Stress on 0.18 micron SOI Devices Through Modification of STI Process. IEEE 2001, pp. 85–86.*

*Optimized Shallow Trench Isolation Structure and Its Process for Eliminating Shallow Trench Isolation Induced Parasitic Effects*, IBM Technical Disclosure Bulletin, Apr. 1992, pp. 276–277.

*Nanoscale CMOS*, Wong, et al. Proceedings of the IEEE, vol. 87, No. 4, Apr. 1999.

Ohno, et al. Experimental 0.25–$\mu$m–Gate Fully Depleted CMOS/SIMOX Process Using a New Two–Step LOCOS Isolation Technique. IEEE Transactions on Electron Devices, vol. 42, No. 8 (Aug. 95), pp. 1481–1486; retrieved from Internet IEEE Xplore Citation wysiwyg://10//http://ieeexplore.ieee.org/. . . %2C+Y.%2C+M.%3B+Tsuchiya%2C+T.

* cited by examiner

LINERLESS SHALLOW TRENCH ISOLATION METHOD

This application claims the benefit of Provisional Application No. 60/278,896 filed Mar. 26, 2001.

FIELD OF THE INVENTION

The present invention relates to a method of manufacturing a semiconductor device comprising trench isolation. The invention has particular applicability in manufacturing high density semiconductor devices with submicron design features and active islands isolated by shallow insulated trenches.

BACKGROUND ART

Current demands for high density and performance associated with ultra large scale integration (ULSI) require submicron features of significantly less than 0.25 microns, increased transistor and circuit speeds and improved reliability. Such demands for increased density, performance and reliability require formation of device features with high precision and uniformity.

Conventional semiconductor devices comprise a substrate and various electrically isolated regions or islands, called active regions, active islands or, simply, islands, in which individual circuit components are formed. The electrical isolation of these active islands is typically accomplished by thermal oxidation of the semiconductor substrate, typically monocrystalline silicon, bounding the active islands. This type of isolation has been referred to as local oxidation of silicon, or LOCOS.

In an effort to enable the further reduction of the size of semiconductor devices, and to enable continued enhancement of transistor and product performance, semiconductor-on-insulator (SOI) wafers increasingly have been used in very-large scale integration (VLSI) or ULSI of semiconductor devices. An SOI wafer typically has a thin layer of silicon on top of a layer of an insulator material. In SOI technology, the semiconductor device is formed entirely in and on the thin layer of silicon, and is isolated from the lower portion of the wafer by the layer of insulator material. In an SOI integrated circuit, essentially complete device isolation may be achieved using conventional device processing methods by surrounding each device, including the bottom of the device, with an insulator. One advantage which SOI wafers have over bulk silicon wafers is that the area required for isolation between devices on an SOI wafer is less than the area typically required for isolation on a bulk silicon wafer.

A type of isolation structure is known as trench isolation, wherein shallow isolation trenches are etched in the substrate between the sites of semiconductor devices and an oxide liner is thermally grown on the trench walls. The trench is then refilled with an insulating material. The resulting structure is referred to as a shallow trench isolation (STI) structure. STI has been widely applied to VLSI and ULSI semiconductor devices, and has been applied recently to SOI integrated circuits for such devices.

Trench isolation has several limitations, which may be exacerbated in SOI devices. One problem is that sharp corners at the top of the trench can result in gate and/or source-drain junction leakage currents and degradation of long-term gate oxide reliability metrics (e.g., voltage-ramp dielectric breakdown (VRDB)). More specifically, such sharp corners may cause unwanted increases in the sub-threshold currents in the channel regions along the edge of the device areas when the FETs are switched on. The device threshold voltage can also be lowered. In order to avoid these problems, it has been found desirable to round the corners of such trenches to increase the radius of curvature and thereby decrease the electric field at the corners. This has been accomplished by, for example, oxidizing the entire inner surface of the newly formed trench, taking advantage of the fact that an exposed corner of a silicon layer etches faster than a flat surface of the silicon layer, thus forming a rounded upper corner at the top of the trench.

However, with SOI devices, the corner rounding solution leads to a new problem. The problem in SOI devices arises as a result of the proximity of the dielectric insulation layer below the silicon active layer. In SOI devices, the shallow isolation trench is etched through the silicon layer to the insulation layer. When the exposed portion of the silicon on the sidewalls of the newly formed trench is oxidized during the process of rounding the corners, a wedge or "bird's beak" of new oxide may form on the underside of the silicon active layer adjacent the isolation trench, between the silicon active layer and the underlying layer of insulating material of the SOI wafer. Thus, as the oxide grows on the sidewalls of the trench, it may grow laterally between the lower edge of the silicon active layer and the underlying oxide insulation layer. In essence, during the process of oxidation which is intended to round the upper corner of the silicon active layer, the lower corner of the silicon active layer is also rounded, forming the "bird's beak" between the silicon active layer and the underlying oxide insulation layer. The problem results when growth of the "bird's beak" creates defects in the silicon crystal structure and/or lifts the silicon layer, due to the pressure of the growing oxide. The defects in the crystal structure may change the electrical characteristics of the semiconductor. The lifting of the silicon layer distorts the surface of the semiconductor device from its desired planarity to an undesirable non-planar condition. As semiconductor device dimensions continue to become smaller, problems such as these both occur more easily and become less tolerable.

Thus, there exists a need for STI methodology applicable to SOI semiconductor devices wherein the problems resulting from sharp corners can be alleviated without creating the problems resulting from "bird's beak" on the underside of the silicon active layer adjacent the isolation trench.

SUMMARY OF THE INVENTION

The present invention provides a method of avoiding formation of the "bird's beak" under the silicon active island while providing rounded upper corners on the silicon active layer in shallow trench isolation of SOI semiconductor devices.

In one embodiment, the present invention relates to a method of isolation of active islands on a silicon-on-insulator semiconductor device, comprising the steps of: providing a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate; forming an isolation trench, the isolation trench defining an active island in the silicon active layer; rounding at least one corner in the active island by application of a high RF bias power high density plasma; and filling the isolation trench with a dielectric trench isolation material by application of a low RF bias power high density plasma.

In another embodiment, the present invention relates to a method of isolation of active islands on a silicon-oninsulator semiconductor device, comprising the steps of providing a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate; forming an isolation trench by etching through the silicon active layer, the isolation trench defining an active island in the silicon active layer; rounding at least one upper corner in the active island by application of a high RF bias power high density plasma, under etching conditions; and filling the isolation trench with a dielectric trench isolation material by application of a low RF bias power high density plasma, under deposition conditions.

The present invention further relates to a silicon-on-insulator semiconductor device, comprising a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate; an isolation trench extending through the silicon active layer, the isolation trench defining an active island in the silicon active layer; at least one rounded upper corner in the active island; and the isolation trench filled with a dielectric trench isolation material comprising atoms of at least one noble gas selected from neon, argon, krypton and xenon and not including a trench liner.

In the present invention, the corners of the isolation trench are rounded and the trench is filled by HDP, without formation of a trench liner. No annealing step is required following the filling step. Thus, it is a feature of the present invention that, following the step of filling the isolation trench with a trench fill material by HDP, no annealing step is undertaken. As a result of these features, a significant savings in processing time and expense can be realized by performing the corner rounding step in the same apparatus used for the filling step, by omitting the formation of a trench liner and by omitting a post-trench filling annealing step. Another significant benefit of the present invention is that a reliable STI structure which includes rounded corners in the silicon active layer can be obtained without formation of a bird's beak at the bottom of the silicon active layer in an SOI wafer.

Thus, the present invention provides methods of STI applicable to SOI semiconductor devices which do not suffer from problems resulting from formation of a "bird's beak" on the underside of the silicon active layer adjacent the isolation trench, while providing for efficient formation of isolation trenches which provide complete electrical isolation of adjacent active islands in the SOI wafer.

DETAILED DESCRIPTION

The method of the present invention may be applied to a silicon-on-insulator (SOI) semiconductor wafer at any time subsequent to the formation of a silicon-on-insulator (SOI) wafer. In one embodiment, the method is applied immediately following fabrication of the SOI wafer, before any semiconductor structures have been formed thereon. In one embodiment, the method is applied following fabrication of the SOI wafer and fabrication of at least some of the elements of a semiconductor device on the SOI wafer.

Figure 1:
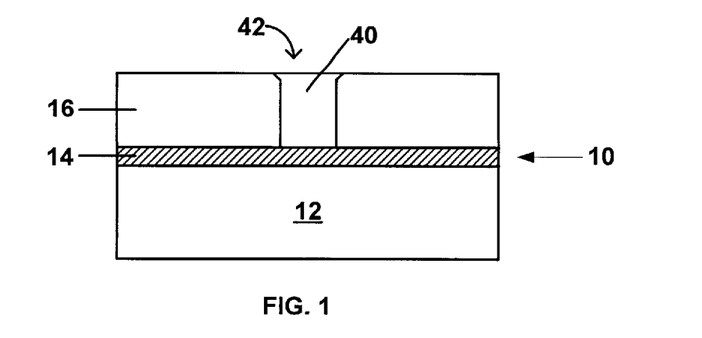
FIG. 1 is a partial cross-sectional view of one embodiment of an SOI wafer following formation of a shallow trench isolation structure, in accordance with the present invention.

The present invention relates to an SOI wafer including a shallow trench isolation (STI) structure between active islands, in which the STI structure is formed by application of a high density plasma (HDP). FIG. 1 is a partial cross-sectional view of an SOI wafer 10 following formation of a shallow isolation trench in accordance with the present invention. The SOI wafer 10 shown in FIG. 1 includes a substrate 12, a dielectric isolation material layer 14 and an active silicon layer 16. The SOI wafer 10 shown in FIG. 1 further includes an STI structure 42 which is formed of a trench isolation material 40. The STI structure 42, including the rounded or chamfered upper corners of the silicon active layer, has been formed by application of HDP, first under etching conditions, in which the upper square corners of the silicon active layer are rounded, and then under deposition conditions, in which the trench is filled with the trench fill material 40. As a result of the HDP, the trench isolation structure 42 is formed and is not annealed subsequently to densify the trench isolation material 40.

The present invention further relates to a method of isolation of active islands on a SOI semiconductor device. In the first step of the method, shown schematically as step S1201 in the flow diagram in FIG. 12, a SOI semiconductor wafer having a silicon active layer, a dielectric isolation layer and a silicon substrate is provided. In one embodiment, the silicon active layer is formed on the dielectric isolation layer and the dielectric isolation layer is formed on the silicon substrate. In one embodiment, the silicon active layer is a monocrystalline silicon. As used herein, the term "monocrystalline" means a crystal lattice structure substantially without defects in the crystal structure and containing few impurities. The SOI wafer may be formed by any technique for forming such wafers, as described more fully below.

Figure 2:
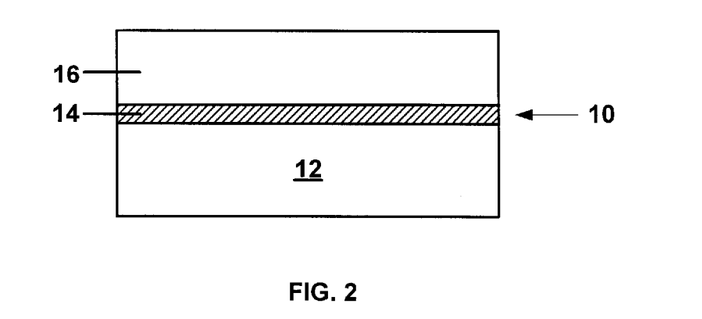
FIG. 2 is a partial cross-sectional view of an SOI wafer.

FIG. 2 shows a partial cross-sectional view of an SOI wafer 10, with a silicon substrate 12, a buried oxide layer 14 and a silicon active layer 16. The silicon active layer 16 may include one or more semiconductor devices. The silicon active layer 16 may be a part of a newly fabricated SOI wafer, in which semiconductor devices have not yet been fabricated. In one embodiment, the silicon active layer 16 is part of an SOI wafer in which a plurality of semiconductor devices have been formed, or are in the process of being formed. In such embodiment, the silicon active layer 16 includes at least one semiconductor device element. The SOI wafer shown in FIG. 2 is only a small portion of a much larger SOI wafer, of which the silicon active layer 16 will be divided into a plurality of active islands, which may be isolated one from another by application of the method of the present invention. As will be understood, while a single isolation structure is shown in the drawings and described in the present disclosure, the method is applicable to formation of a plurality of such isolation structures simultaneously.

The SOI wafer 10 provided in the step S1201 and used in the present invention may be any SOI wafer formed by any techniques known in the art for forming SOI wafers, or by any other method of forming SOI wafers. The present invention, as described herein, is applied to a previously formed SOI wafer, and thus is not limited to any particular method of forming the SOI wafer.

Figure 12:
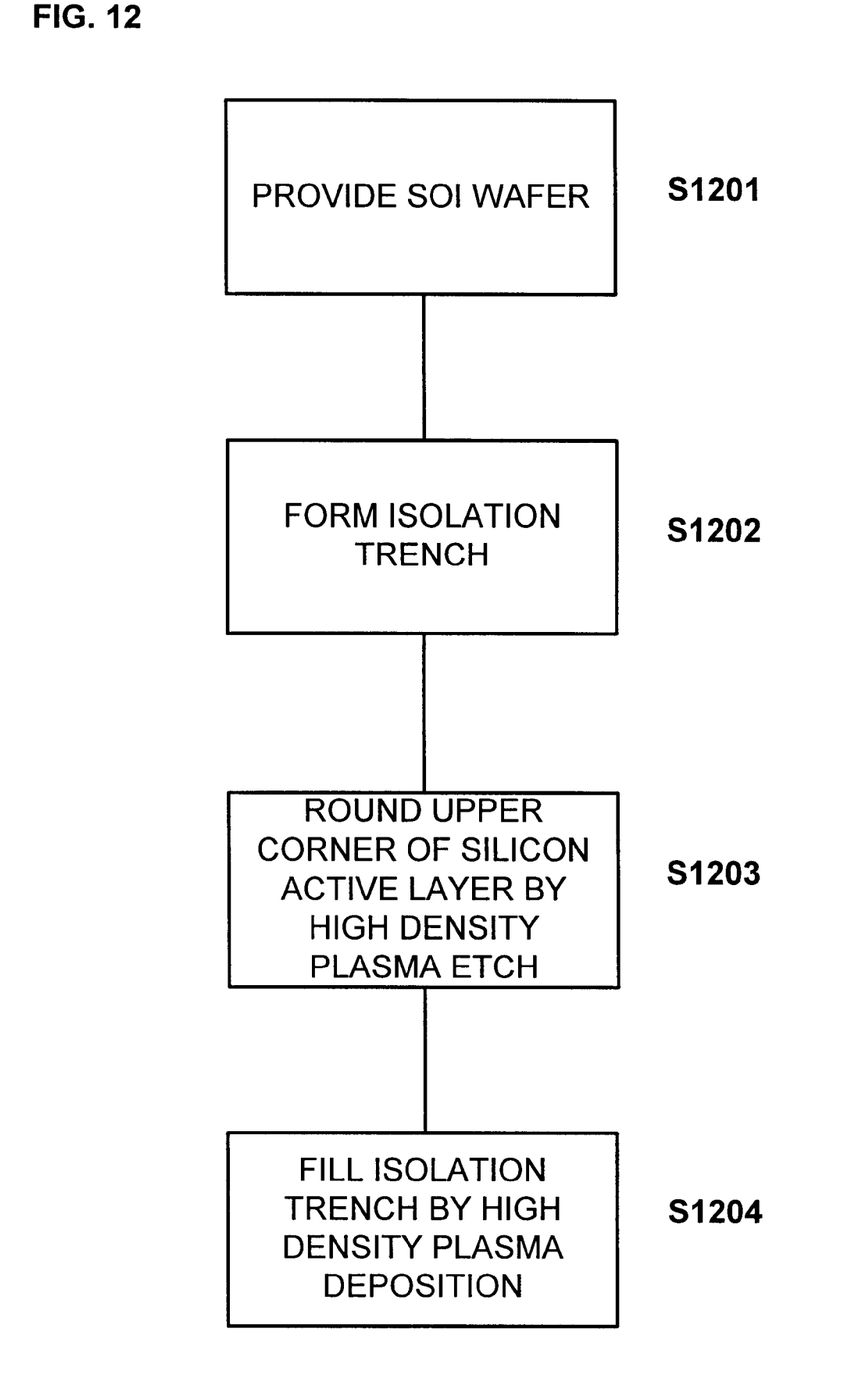
FIG. 12 is a is a flow diagram of one embodiment of a method of isolation of active islands on a SOI wafer.

In the second step of the method of the present invention, shown schematically as step S1202 in the flow diagram in FIG. 12, an isolation trench is formed by etching the silicon active layer. In forming the isolation trench, at least one active island is defined in the silicon active layer. The isolation trench may be formed by a series of conventional steps, as will be recognized upon review of FIGS. 2–6. The step(s) of forming the isolation trench may be carried out by any known method for forming a shallow isolation trench, and the method of the present invention is not limited to any particular process for forming the trench.

Figure 3:
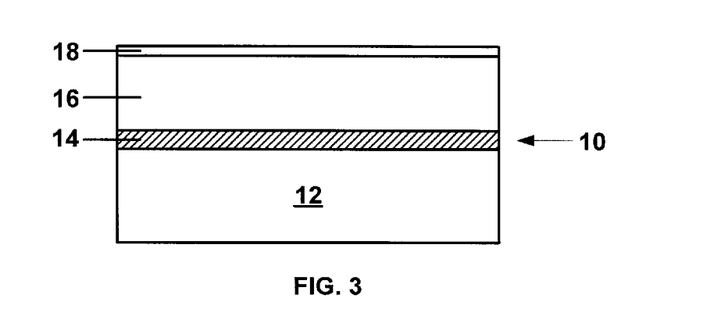
FIG. 3 is a partial cross-sectional view of an SOI wafer following application of a pad oxide layer.
Figure 4:
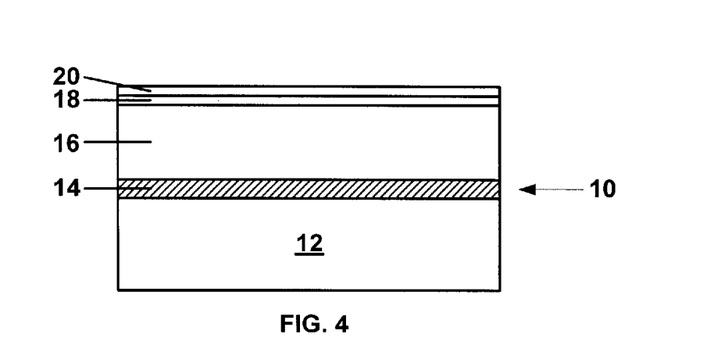
FIG. 4 is a partial cross-sectional view of an SOI wafer following application of a hard mask layer over a pad oxide layer.
Figure 5:
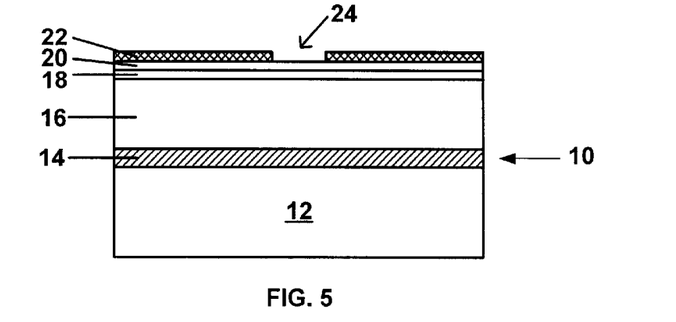
FIG. 5 is a partial cross-sectional view of an SOI wafer following application of a patterned photoresist layer over a hard mask layer and pad oxide layer.

A typical method of trench formation comprises initially growing a pad oxide layer 18 on the substrate, as shown in FIG. 3. A hard mask layer 20, such as a nitride layer, is then deposited over the pad oxide, as shown in FIG. 4. A photoresist mask layer 22 is then applied to define the trench areas 24.

Figure 6:
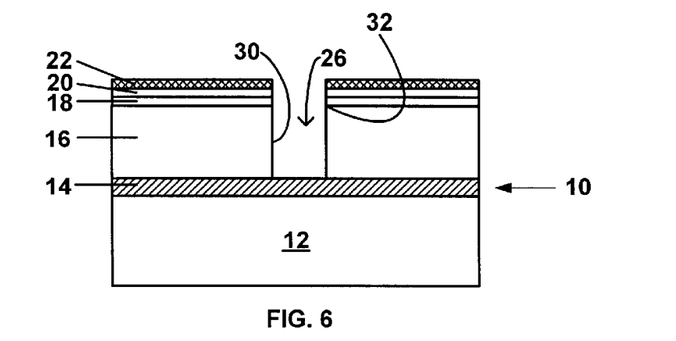
FIG. 6 is a partial cross-sectional view of the SOI wafer of FIG. 5 following one or more steps of etching to form an isolation trench.

In the etching steps, the exposed portions of the nitride layer 20, are first etched away, followed by etching away of the exposed pad oxide layer 18. The etching continues into the thus-exposed active silicon layer 16, down to the dielectric insulation layer 14, to form the shallow trench 26, as shown in FIG. 6. As shown in FIG. 6, the isolation trench 26 reaches the underlying dielectric isolation layer 14, and thus leaves substantially no unetched silicon at the bottom of the isolation trench 26. The etching step is continued to "etch through", in which the etching reaches the underlying dielectric isolation layer. Any method known in the art for etching the various layers which have been applied over the silicon active layer 16 of the SOI wafer 10 may be used to form the isolation trench 26. When the etching is completed upon this "etch through", the isolation trench 26 is formed, as shown in FIG. 6.

The isolation trench 26 embodiment illustrated in FIG. 6 includes square upper corners 32. The square or substantially square upper corners 32, if allowed to remain in the SOI wafer 10, may result in undesirable electronic effects, as discussed above.

Figure 7A:
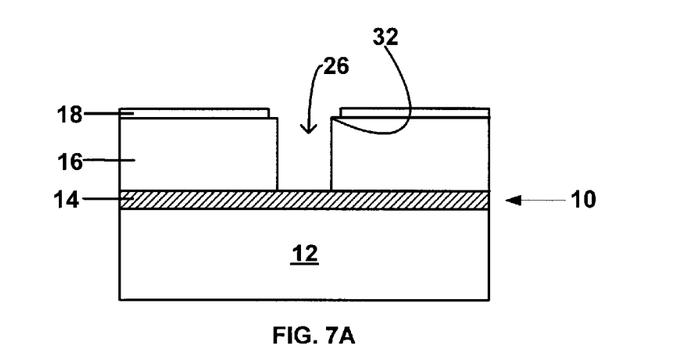
FIG. 7A is a partial cross-sectional view of one embodiment of an SOI wafer in which the photoresist and hard mask layers have been removed, and the pad oxide etched back.
Figure 7B:
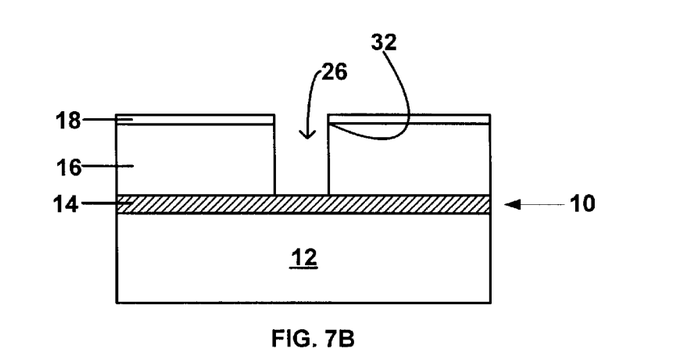
FIG. 7B is a partial cross-sectional view of another embodiment of an SOI wafer in which the photoresist and hard mask layers have been removed, without the pad oxide being etched back.

As shown in FIGS. 7A and 7B, both the photoresist layer 22 and the hard mask layer 20 may be removed following formation of the isolation trench 26. In the embodiment shown in FIG. 7A, the pad oxide layer 18 has been etched back slightly from the edge of the isolation trench 26, to provide more access to the upper corner 26 of the silicon active layer 16. In the embodiment shown in FIG. 7B, the pad oxide layer 18 is not etched back, and so extends to the edge of the isolation trench 26, as shown in FIG. 6.

In a conventional process, the next step would be oxidation of the exposed silicon on the trench walls to form an oxide liner on the walls to control the silicon-silicon dioxide interface quality and to remove etching-induced damage, and to round upper corners in the silicon active layer. However, this method of forming an oxide liner may give rise to the problem of the bird's beak at the bottom of the isolation trench and silicon active layer, as discussed above. In the method of the present invention, no oxide liner is formed.

In the third step of the method of the present invention, shown schematically as step S1203 in the flow diagram in FIG. 12, at least one corner 32 of the active island in an upper portion of the silicon active layer 16 is rounded by application of a high density plasma (HDP), under etching conditions. A high density plasma may be controlled so as to result in etching, as opposed to deposition, by selection and adjustment of the HDP conditions. If the HDP is applied at a high RF bias power setting, in the presence of oxygen or other reactive gas, in the absence of deposition-material ingredients such as silicon present, the HDP etches the silicon of the silicon active layer 16, rather than depositing thereon. Thus, the HDP is operated under etching conditions. As a result, a substrate to which the HDP under etching conditions is exposed is etched. The HDP under etching conditions etches both a portion of the pad oxide layer 18 near the isolation trench 26 and the upper square corner 32 to form a rounded corner 34.

Due to the angle of incidence of the plasma gases on the surface, the pad oxide 18 and the silicon 16 at the corners 32 are preferentially etched. The third step of the method applies the HDP under etching conditions to round the upper square corners 32 of the silicon active layer 16. The etching is produced by addition of oxygen and at least one gas such as neon, argon, xenon or krypton to the plasma generation conditions. These gases are ionized by the plasma and as ions can be accelerated by the applied magnetic field to cause etching. The ions of the at least one gas such as neon, argon, xenon or krypton etch both the silicon 16 at the corners 32 and the pad oxide 18. The oxygen may react with the silicon etched from the corners by the inert gas ions, to form silicon oxides which may be deposited elsewhere in the trench 26. Etched portions of the pad oxide 18 may also be deposited in the trench 26.

Figure 8:
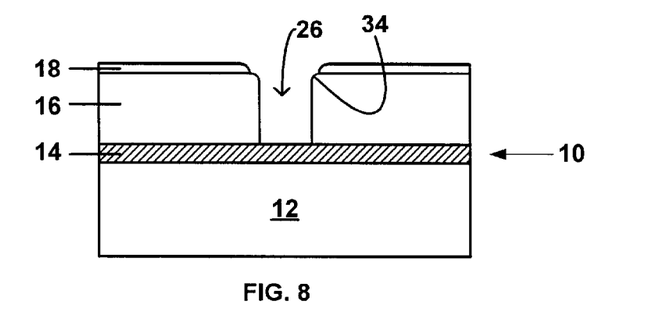
FIG. 8 is a partial cross-sectional view of one embodiment, similar to that shown in FIG. 7A, following a step of corner rounding by application of a HDP etch.
Figure 9:
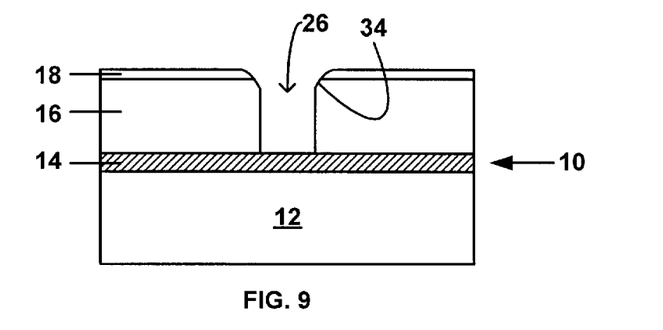
FIG. 9 is a partial cross-sectional view of another embodiment, similar to that sown in FIG. 7B, following a step of corner rounding by application of a HDP etch.

Thus, in one embodiment, in the third step, the upper square corners 32 are rounded by application of a HDP under etching conditions, comprising oxygen and at least one gas selected from neon, argon, krypton and xenon, at a high RF bias power. The result of application of a HDP under etching conditions is shown schematically in FIGS. 8 and 9. An HDP plasma has been formed and applied to the upper surface of the SOI wafer 10 of FIGS. 7A and 7B, with feeds of oxygen and, e.g., xenon gas into the plasma, resulting in corner rounding as shown respectively in FIGS. 8 and 9. As shown in FIGS. 8 and 9, in addition to the corner rounding, a portion of the pad oxide layer 18 adjacent the isolation trench 26 has been etched away.

Application of HDP under etching conditions may comprise use of, e.g., an electron cyclotron resonance (ECR) system, or a parallel plate, transformer coupled plasma (TCP). Such systems are described in more detail, e.g., in U.S. Pat. No. 6,106,678, the disclosure of which is incorporated herein by reference. The ECR apparatus includes a plasma generation chamber, in which the plasma is generated, and a reaction chamber, in which the SOI wafer 10 is mounted and reactions between the plasma gases and the wafer substrate take place. The TCP apparatus includes a single process chamber in which plasma is generated adjacent the substrate, such as the SOI wafer 10.

Application of HDP under etching conditions generally includes application of high RF bias power together with an etching gas comprising a gas such as oxygen and at least one gas selected from neon, argon, krypton and xenon. During operation of HDP under etching conditions, no source of silicon is provided to the HDP apparatus, other than the silicon on the SOI wafer 10 to which the HDP is applied. The operating conditions of the HDP under etching conditions, such as gas flows, chamber pressure, and level of RF bias power which constitutes a high RF bias power, may be determined and selected as follows.

In an ECR system, a high density plasma is generated by the combination of microwave energy transmitted through a microwave guide and magnetic energy generated by electromagnetic coils. The HDP is generated from a suitable gas or gas mixture such as oxygen and at least one gas selected from neon, argon, krypton and xenon. The high density plasma is directed to the substrate by application of an RF bias to the substrate. The reaction chamber is evacuated to a pressure in the range from about $10^{-4}$ to about $10^{-2}$ Torr. The flow rate of oxygen into the plasma generation chamber is in the range from about 50 to about 500 sccm for a 200 mm wafer. The flow rate of the at least one gas selected from neon, argon, krypton and xenon into the plasma generation chamber is in the range from about 50 to about 500 sccm for a 200 mm wafer. Under etching conditions, no silicon is provided to the reaction chamber of the ECR apparatus.

In an ECR system, for HDP under etching conditions, the RF bias power is applied in the range from about 1000 watts (W) to about 3000 W. In one embodiment, the RF bias power is applied in the range from about 1500 W to about 2500 W. In another embodiment, the RF bias power is applied at about 2000 W. For a given plasma gas, the higher the RF bias power, the greater the degree of etching. For the plasma gases oxygen plus one or more of neon, argon, krypton and xenon, the greater the size and molecular weight of the ions generated, the greater the degree of etching. Thus, based on the desired degree of corner rounding, the desired speed of the corner rounding step, and the desired degree of control, a person of skill in the art may select ECR-HDP conditions. For example, when Kr is used, a RF bias power of about 2000 W to about 2500 W may be adequate to obtain an etch which results in the desired corner rounding. When Xe is used, a RF bias power of about 1200 W to about 1600 W may be adequate to obtain an etch wich results in the desired corner rounding. As will be understood, the time for which the HDP under etching conditions is applied varies depending on the degree of corner rounding (i.e., etch depth) desired, the speed and level of control of the process desired, and the gas used and the RF bias power applied. The time required will typically range from about 1 second to about 100 seconds.

In the TCP system, the chamber is maintained at a vacuum pressure of less than about 100 torr and the flow rates of the reactant gases are in the range from about 10 to about 200 sccm each for oxygen and the at least one gas selected from neon, argon, krypton and xenon. The TCP power can range from about 200 W to about 2000 W, and the RF bias power applied to the bottom electrode can range from about 1000 to about 2500 W for the HDP under etching conditions. In one embodiment, the RF bias power is applied in the range from about 1500 W to about 2200 W. In another embodiment, the RF bias power is applied at about 1800 W. The same general principles apply to the TCP system as to the ECR system, with respect to the selection of etching gases, RF bias power applied, time of application, and the same ranges of variables.

During the step of corner rounding, some deposition of silicon dioxide may result, but the primary effect is etching of the upper corners 32 of the silicon active layer 16. A portion of the overlying pad oxide layer 18 may be etched away as well. The etching of the pad oxide layer 18 is shown schematically in FIGS. 8 and 9. As will be recognized, the degree of etching and corner rounding may be selected based on the size of the SOI wafer 10, the average feature size (i.e., 0.18 micron or less) and the aspect ratio (depth/width) of the isolation trench of interest. The degree of etching and corner rounding may be controlled by varying the conditions of the HDP etching conditions, based on the factors discussed above.

Corner rounding has been found useful in avoiding undesired electronic effects resulting from sharp corners in the silicon active layer 16. As shown in FIGS. 6 and 7, the silicon active layer 16 includes a square upper corner 32. If the square upper corner 32 is not rounded, the sharpness of the square upper corner 32 may result in the undesired electronic effects described in the above background section. Thus, it is desirable that the square upper corner 32 be rounded.

The term "round" or "rounding" or "rounded" as used herein refers to the change in one or more corners of the silicon active layer 16 from a condition in which the corner is sharp and square or substantially square, to a condition in which the corner has been rounded or otherwise rendered not square so that the undesired electronic effects are not observed. Rounding may include actual rounding, in which the corner is changed to have a regular radius of curvature, i.e., to include a "curved corner" having a regular curve, may include rounding in which the corner has an uneven, irregular curve such as an ellipsoid curve, may include cambering, in which the corner is changed to have a chamfered face, and may include multiple chamfers, in which the corner is changed to have a series of chamfered faces, i.e., a "polygonal corner".

As shown in FIGS. 8 and 9, the rounded upper corners 34 have been formed from the square upper corner 32 of the silicon active layer 16 shown in FIGS. 6, 7A and 7B. The embodiment shown in FIG. 1 has a silicon active layer 16 demonstrating an embodiment in which the rounded upper corner 34 has been rounded to form a chamfered rounded corner. The embodiments shown in FIGS. 8–11 include rounded corners 34 which have a regular radius of curvature. The scope of the invention is not limited to any particular "rounded" corner. As described above, the step of rounding the corner may produce a rounded corner 34 having a variety of shapes, with the only proviso being that the rounded corner 34 not cause the disfavored electronic effects which would result if the square corner 32 was allowed to remain in the SOI wafer 10.

In the fourth step of the method of the present invention, shown schematically as step S1204 in the flow diagram of FIG. 12, the isolation trench is filled with a trench isolation material. The trench isolation material may be any material known in the art for use as an isolation material for shallow trench isolation in semiconductor devices. The present method is not limited to any particular trench isolation material.

In one embodiment, the isolation trench 26 is filled with trench isolation material 40 applied by HDP under deposition conditions. The HDP under deposition conditions forms a layer of the trench isolation material over the entire surface of the SOI wafer 10, which includes filling all gaps such as the isolation trench 26 by HDP under deposition conditions.

HDP under deposition conditions comprises introduction of at least one reactant gas to form the trench isolation material. Thus, in HDP under deposition conditions, in addition to the oxygen and the at least one gas selected from neon, argon, krypton and xenon, a reactant gas is introduced into the plasma reaction chamber. The reactant gas includes a material which, when reacted with oxygen in the plasma, forms a dielectric trench isolation material. In one embodiment, in HDP under deposition conditions, in addition to the oxygen and the at least one gas selected from neon, argon, krypton and xenon, a silicon containing gas is introduced into the plasma reaction chamber. As a result, a silicon oxide is deposited by the HDP under deposition conditions. The silicon containing gas may be, for example, silane, $SiH_4$ or an organosilicon compound, such as an alkyl silane, e.g., tetramethyl or tetraethyl silane, or an alkoxysilane, such as tetramethoxy or tetraethoxy silane. In another embodiment, the organosilicon compound may be a mixed alkyl alkoxy silane compound. In another embodiment, the reactant gas comprises germanium, and in another, aluminum. The reactant gas may be any material known in the art which, when reacted with the oxygen of the HDP, forms a dielectric trench isolation material. For HDP under deposition conditions, the oxygen and the at least one gas selected from neon, argon, krypton and xenon are supplied to the reaction chamber in substantially the same manner as for HDP under etching conditions, and, in addition to the these gases, the reactant gas, e.g., a silicon-containing gas, is provided to the HDP apparatus. In another embodiment, the reactant gas comprises, in addition to silicon or germanium, a nitrogen source, such as ammonia or hydrazine. In such an embodiment, the trench isolation material may be, for example, silicon oxynitride.

In both the ECR and the TCP systems, operation of the apparatus to obtain HDP under deposition conditions includes similar conditions to those described above with respect to HDP under etching conditions, with two exceptions. First, under deposition conditions, the apparatus is operated at a reduced RF bias power as compared to under etching conditions. The reduced RF bias power results in a low etch to deposition ratio, thereby obtaining deposition of the trench isolation material. Second, under deposition conditions, an external supply of silicon is provided to the plasma, i.e., silicon is provided in addition to the silicon of the SOI wafer 10 to which the HDP plasma is applied. The reactant gas provides the material for deposition when reacted with the oxygen in the plasma.

In the ECR system, when the apparatus is operated for HDP under deposition conditions, the RF bias power is applied in the range from about 800 watts to about 2000 watts. In one embodiment, under deposition conditions, in the ECR system the RF bias power is applied in the range from about 1000 watts to about 1500 watts. The silicon is provided as a silicon containing gas, as described above. The gas flow rate of the silicon containing gas is in the range from about 50 sccm to about 500 sccm. In one embodiment, the gas flow rate of silicon containing gas is in the range from about 100 sccm to about 300 sccm. In the ECR apparatus, the deposition rate of the silicon oxide under these gas flow conditions and RF bias power is in the range from about 2000 Å/min to about 10,000 Å/min.

In the TCP system, when the apparatus is operated for HDP under deposition conditions, the RF bias power is applied in the range from about 500 watts to about 1500 watts. In one embodiment, under deposition conditions, in the TCP system the RF bias power is applied in the range from about 750 watts to about 1000 watts. The silicon is provided as a silicon containing gas, as described above. The gas flow rate of the silicon containing gas is in the range from about 20 sccm to about 300 sccm. In one embodiment, the gas flow rate of silicon containing gas is in the range from about 100 sccm to about 200 sccm. In the TCP apparatus, the deposition rate of the silicon oxide under these gas flow conditions and RF bias power is in the range from about 1500 Å/min to about 5,000 Å/min.

In one embodiment, the trench 26 is filled by a method other than HDP. For example, in one embodiment, the trench isolation material 40 is deposited by LPCVD. In other embodiments, the trench may be filled by any method known in the art.

Figure 11:
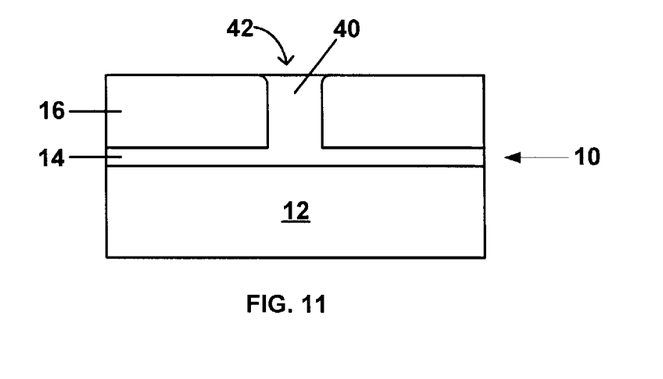
FIG. 11 is a partial cross-sectional view of another embodiment of an SOI wafer following formation of a shallow isolation trench, in accordance with the present invention, similar to that of FIG. 1.

In one embodiment, the trench isolation material is silicon dioxide. In one embodiment, the trench isolation material is silicon dioxide and the pad oxide layer 18 is silicon dioxide. In one embodiment, the trench isolation material is silicon dioxide, the pad oxide layer 18 is silicon dioxide and these two elements form a combined structure in which the two materials are joined and in which there is no definite line of separation between them, although they have been formed in separate, different steps. The embodiment shown in FIG. 11 is a schematic depiction of such an embodiment, since there is no clear demarcation between the parts.

Figure 10:
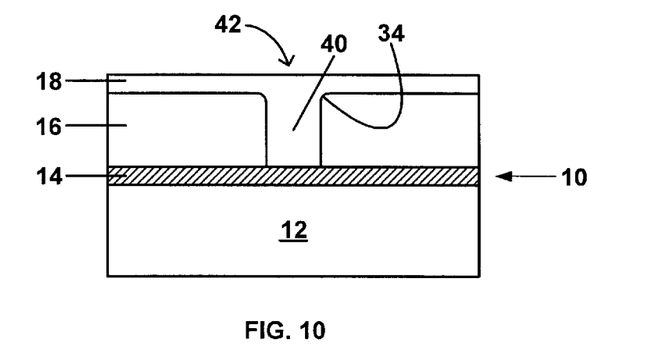
FIG. 10 is a partial cross-sectional view of an embodiment of an SOI wafer following a step of filling the isolation trench with a dielectric isolation material by HDP deposition.

As suggested by FIG. 10, in an embodiment in which the pad oxide layer 18 and the trench isolation material 40 are both the same material or are substantially similar materials, these structures may form a combined structure of which the parts are essentially indistinguishable from each other, although they were formed by different process steps at different times in the method of the present invention. The SOI wafer 10 shown in FIG. 10 is a schematic representation of such a structure, in which the separate parts are not distinctly separated. In one embodiment, the pad oxide layer 18 and the trench isolation material 40 are both silicon dioxide. In one such embodiment, these parts are indistinguishable from each other except at a microscopic or crystallographic scale.

As shown in FIG. 10, in one embodiment, a trench isolation material 40 is formed so as to fill the isolation trench 26 from a level beginning at the bottom of the isolation trench 26 to a level above the silicon active layer 16 and the pad oxide layer 18.

The trench isolation material 40, shown in FIG. 10, may be formed of any material known in the art. In one embodiment, the trench isolation material 40 is an oxide of silicon. In one embodiment, the trench isolation material 40 is silicon dioxide, $SiO_2$. The trench isolation material may comprise other dielectric materials, such as silicon oxynitride or silicon nitride, which can provide the function of electrically insulating adjacent active islands on an SOI wafer from each other, and which may be deposited by HDP under deposition conditions. For example, to form a nitrogen containing trench isolation material, a source of nitrogen such as ammonia or hydrazine may be provided to the plasma reaction chamber, in addition to the other gases discussed above.

In a conventional process, following the step of filling an isolation trench, the semiconductor wafer must be annealed, typically at temperatures in excess of 900° C. The annealing step is conventionally required for densification of the trench fill material, or to remove impurities such as water from the trench fill material, or both, or for other reasons.

In the present invention, because the isolation trench 26 is filled by HDP under deposition conditions, no annealing step is required following the filling step. Thus, it is a feature of the present invention that, following the step of filling the isolation trench 26 with a trench fill material by HDP under deposition conditions, no annealing step is undertaken. As a result of these features, a significant savings in processing time and expense can be realized by omitting the formation of a trench liner and omitting a post-trench filling annealing step. In addition, a further significant benefit of the present invention is that a reliable STI which includes rounded corners in the silicon active layer can be obtained without formation of a bird's beak at the bottom of the silicon active layer in an SOI wafer.

In one embodiment of the present invention, the semiconductor device is annealed at a temperature less than 1100° C. following the step of filling the trench.

Following deposition of the trench isolation material 40, excess material is removed from the SOI wafer 10, to produce a SOI wafer 10 as shown in FIG. 1, in which respective silicon active layers of adjacent active islands have been separated by a shallow trench isolation (STI) structure 42. The STI structure 42 shown in FIG. 1 is formed of the trench isolation material 40 and the trench oxide liner.

FIG. 11 shows an embodiment of the SOI wafer 10 obtained by the method of the present invention similar to that shown in FIG. 1. As suggested by FIG. 11, in an embodiment in which the shallow trench isolation structure 40 and the dielectric isolation layer 14 are both formed of the same material or are formed of substantially similar materials, such as silicon dioxide, these structures may form a combined structure in which the parts are essentially indistinguishable from each other, although they were formed by different process steps at different times in the method of the present invention. The SOI wafer 10 shown in FIG. 11 is a schematic representation of such a structure, in which the separate parts are not distinctly separated. In one embodiment, the trench isolation material 40 and the dielectric isolation layer 14 are both silicon dioxide.

Thus, the method of the present invention provides a shallow trench isolation structure which substantially completely electrically isolates and which defines an active island in the silicon active layer of the SOI wafer. In one embodiment, the shallow trench isolation structure and the dielectric isolation layer form an integral isolation structure for and define an active island in the silicon active layer of the SOI wafer.

Following the steps of the present invention, the SOI wafer may be further processed in the fabrication of semiconductor devices in a known manner.

What has been described above are certain embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of isolation of active islands on a silicon-on-insulator semiconductor device, comprising the steps of:
   providing a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate;
   forming an isolation trench, the isolation trench defining an active island in the silicon active layer;
   rounding at least one corner in the active island by application of a high RF bias power high density plasma; and
   filling the isolation trench with a dielectric trench isolation material by application of a low RF bias power high density plasma,
   wherein the step of rounding at least one corner is carried out without formation of a bird's beak under the active island.

2. The method of claim 1, wherein a shallow trench isolation structure is formed without first forming an oxide trench liner.

3. The method of claim 1, wherein a shallow trench isolation structure is formed without first oxidizing sidewalls in the isolation trench.

4. The method of claim 1, wherein the semiconductor device is annealed at a temperature less than 1100° C. following the step of filling the trench.

5. The method of claim 1, wherein the high density plasma is electron cyclotron resonance plasma chemical vapor deposition.

6. The method of claim 1, wherein the high density plasma is transformer coupled plasma chemical vapor deposition.

7. The method of claim 1, wherein the step of forming the isolation trench etches through the active silicon layer to the insulating dielectric layer.

8. The method of claim 1, wherein in the step of rounding at least one corner, the plasma gas comprises oxygen and a noble gas.

9. The method of claim 1, wherein in the step of filling, the plasma gas comprises oxygen, silicon and a noble gas.

10. A method of isolation of active islands on a silicon-on-insulator semiconductor device, comprising the steps of:
    providing a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate;
    forming an isolation trench by etching through the silicon active layer, the isolation trench defining an active island in the silicon active layer;
    rounding at least one upper corner in the active island by application of a high RF bias power high density plasma, under etching conditions; and
    filling the isolation trench with a dielectric trench isolation material by application of a low RF bias power high density plasma, under deposition conditions,
    wherein the step of rounding at least one corner is carried out without formation of a bird's beak under the active island.

11. The method of claim 10, wherein the etching conditions comprise an etch to deposition ratio resulting in etching of silicon from the corners.

12. The method of claim 10, wherein the deposition conditions comprise forming a plasma gas comprising oxygen and at least one gas selected from neon, argon, krypton and xenon, and providing a source of a reactant gas to the plasma.

13. The method of claim 12, wherein the reactant gas comprises silicon.

14. The method of claim 10, wherein the deposition conditions comprise an etch to deposition ratio resulting in deposition of the dielectric trench isolation material in the isolation trench.

15. The method of claim 10, wherein the high density plasma is electron cyclotron resonance plasma chemical vapor deposition.

16. The method of claim 10, wherein the high density plasma is transformer coupled plasma chemical vapor deposition.

17. The method according to claim 10, wherein a shallow trench isolation structure is formed without first forming a sidewall in the isolation trench.

18. A method of isolation of active islands on a silicon-on-insulator semiconductor device, comprising the steps of:

providing a silicon-on-insulator semiconductor wafer having a silicon active layer, a dielectric isolation layer and a silicon substrate, in which the silicon active layer is formed on the dielectric isolation layer and the dielectric isolation layer is formed on the silicon substrate;

forming an isolation trench by etching through the silicon active layer, the isolation trench defining an active island in the silicon active layer;

rounding at least one upper corner in the active island by application of a high RF bias power high density plasma, under etching conditions, to form a shallow trench isolation structure; and filling the isolation trench with a dielectric trench isolation material by application of a low RF bias power high density plasma, under deposition conditions, wherein the step of rounding at least one corner is carried out without formation of a bird's beak under the active island and the shallow trench isolation structure is formed without first forming a sidewall in the isolation trench.

* * * * *